United States Patent
Ueno et al.

(10) Patent No.: US 10,612,740 B2
(45) Date of Patent: Apr. 7, 2020

(54) LIGHT-EMITTING DEVICE, ILLUMINATION APPARATUS, AND MOVING BODY

(71) Applicant: PANASONIC INTELLECTUAL PROPERTY MANAGEMENT CO., LTD., Osaka (JP)

(72) Inventors: Yasuharu Ueno, Osaka (JP); Makoto Kai, Kyoto (JP); Tetsuya Nishi, Osaka (JP); Toshiaki Nakamura, Osaka (JP); Yuuji Nakayama, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/135,550

(22) Filed: Sep. 19, 2018

(65) Prior Publication Data

US 2019/0093844 A1 Mar. 28, 2019

(30) Foreign Application Priority Data

Sep. 26, 2017 (JP) .................... 2017-185386

(51) Int. Cl.
*F21S 41/25* (2018.01)
*H01L 33/60* (2010.01)
(Continued)

(52) U.S. Cl.
CPC ............ *F21S 41/25* (2018.01); *F21S 41/141* (2018.01); *F21S 41/32* (2018.01); *F21S 41/68* (2018.01);
(Continued)

(58) Field of Classification Search
CPC ...... F21S 41/141; F21S 41/143; F21S 41/145; F21S 41/25; F21S 41/321; F21S 41/68; F21S 45/47; F21S 41/147; H01L 33/50; H01L 33/60; F21V 13/14; F21V 29/70; F21V 29/763

See application file for complete search history.

(56) References Cited

U.S. PATENT DOCUMENTS 7,812,363 B2 * 10/2010 Higashi ............... H01L 25/0753
257/98
7,922,375 B2 * 4/2011 Tatsukawa ............ F21V 29/763
362/516

(Continued)

FOREIGN PATENT DOCUMENTS

JP 2004-158294 6/2004
JP 2011-238497 11/2011

*Primary Examiner* — Peggy A Neils
(74) *Attorney, Agent, or Firm* — Greenblum & Bernstein, P.L.C.

(57) ABSTRACT

A moving-body light-emitting device for a vehicle includes: a light source including a light-emitting element; a substrate on which the light source is provided; a first lens that covers the light-emitting element and includes a curved surface that transmits light emitted from the light-emitting element, the curved surface including a first curved surface and a second curved surface; and a reflective surface that covers the first curved surface of the first lens and reflects the light transmitted through the first lens. The second curved surface of the first lens is not covered with the reflective surface, and transmits the light reflected by the reflective surface.

11 Claims, 4 Drawing Sheets

(51) Int. Cl.
*F21V 13/14* (2006.01)
*F21V 29/76* (2015.01)
*F21V 29/70* (2015.01)
*F21S 41/68* (2018.01)
*F21S 41/141* (2018.01)
*F21S 45/47* (2018.01)
*F21S 41/32* (2018.01)
*H01L 33/50* (2010.01)

(52) U.S. Cl.
CPC .............. *F21S 45/47* (2018.01); *F21V 13/14* (2013.01); *F21V 29/70* (2015.01); *F21V 29/763* (2015.01); *H01L 33/60* (2013.01); *H01L 33/502* (2013.01)

(56) References Cited

U.S. PATENT DOCUMENTS

| | | | |
|---|---|---|---|
| 10,180,228 B2 * | 1/2019 | Nakazato | B60Q 1/18 |
| 2003/0076688 A1 * | 4/2003 | Kobayashi | F21S 41/686 |
| | | | 362/510 |
| 2004/0136197 A1 | 7/2004 | Ishida | |
| 2010/0110715 A1 * | 5/2010 | Nakada | F21S 41/147 |
| | | | 362/538 |
| 2016/0131336 A1 * | 5/2016 | Kim | F21S 43/13 |
| | | | 362/84 |
| 2019/0309922 A1 * | 10/2019 | Fischer | H01L 33/54 |

\* cited by examiner

LIGHT-EMITTING DEVICE, ILLUMINATION APPARATUS, AND MOVING BODY

CROSS REFERENCE TO RELATED APPLICATION

This application claims the benefit of priority of Japanese Patent Application Number 2017-185386 filed on Sep. 26, 2017, the entire content of which is hereby incorporated by reference.

BACKGROUND

1. Technical Field

The present disclosure relates to a light-emitting device for a moving body, an illumination apparatus for a moving body, and a moving body.

2. Description of the Related Art

Conventionally, a lamp that includes: a semiconductor light-emitting device including a semiconductor light-emitting layer having an optical axis in a direction intersecting with a light-emitting surface; and an optical member including a light-emitting surface of the semiconductor light-emitting device or a reflective surface has been disclosed (see Japanese Unexamined Patent Application Publication No. 2011-238497, for example). The semiconductor light-emitting layer is entirely covered with a transparent resin lens. An air layer is present between the reflective surface and the semiconductor light-emitting device, and the reflective surface is disposed at a position separate from the transparent resin lens.

SUMMARY

In recent years, there has been a demand for downsizing the light-emitting device.

In view of this, the present disclosure has an object to provide a light-emitting device, an illumination apparatus, and a moving body that are capable of being downsized.

In order to achieve the above object, a light-emitting device according to the present disclosure is a light-emitting device for a moving body. The light-emitting device includes: a light source including a light-emitting element; a substrate on which the light source is provided; a first lens that covers the light-emitting element and includes a curved surface that transmits light emitted from the light-emitting element, the curved surface including a first portion and a second portion; and a reflective surface that covers the first portion of the curved surface of the first lens and reflects the light transmitted through the first lens. The second portion of the curved surface of the first lens is not covered with the reflective surface, and transmits the light reflected by the reflective surface.

Further, an illumination apparatus according to an aspect of the present disclosure includes a light-emitting device; a second lens that is provided in front of the light-emitting device in the direction of travel of the moving body, and receives light emitted from the light-emitting device; and a shield that is provided between the light-emitting device and the second lens and shields a portion of the light emitted from the light-emitting device.

Furthermore, a moving body according to an aspect of the present disclosure includes a headlight including the light-emitting device or the illumination apparatus.

The present disclosure can achieve downsizing.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENTS

The following describes embodiments of the present disclosure with reference to the drawings. Note that each of the following embodiments is a specific example of the present disclosure. Accordingly, the numerical values, shapes, materials, structural elements, arrangement and connection of the structural elements, etc., indicated in the following embodiments are mere examples and are not intended to limit the present disclosure. Therefore, among the structural elements in the following embodiments, those not recited in any one of the independent claims defining the broadest concepts of the present disclosure are described as optional elements.

Furthermore, the term "approximately" is intended to mean, for example in the case of "approximately the same", not only exactly the same, but also what would be recognized as essentially the same. Moreover, the term "vicinity" is intended to mean, for example in the case of "in the vicinity of . . . ", in contact with " . . . " or located within several centimeters from " . . . ".

Note that each figure is a schematic illustration and not necessarily a precise illustration. Further, throughout the figures, the same reference signs are given to essentially the same structural elements, and redundant descriptions are omitted or simplified.

The following describes a moving-body light-emitting device, a moving-body illumination apparatus, and a moving body according to embodiments of the present disclosure.

Embodiment 1

Configuration

Figure 1:
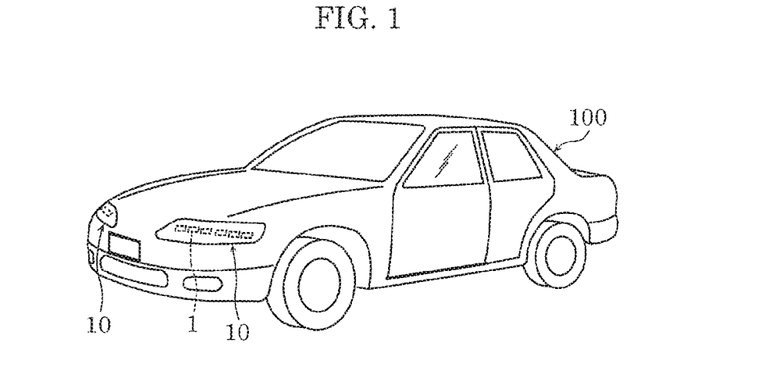
FIG. 1 is a schematic diagram illustrating a vehicle according to Embodiment 1.

FIG. 1 is a schematic diagram illustrating vehicle 100 according to Embodiment 1.

As illustrated in FIG. 1, moving-body illumination apparatus 1 is used in vehicle headlight 10 installed in vehicle 100. Moving-body illumination apparatus 1 is electrically connected to an electrical system of vehicle 100. Moving-body illumination apparatus 1 is an example of the illumination apparatus.

Figure 2A:
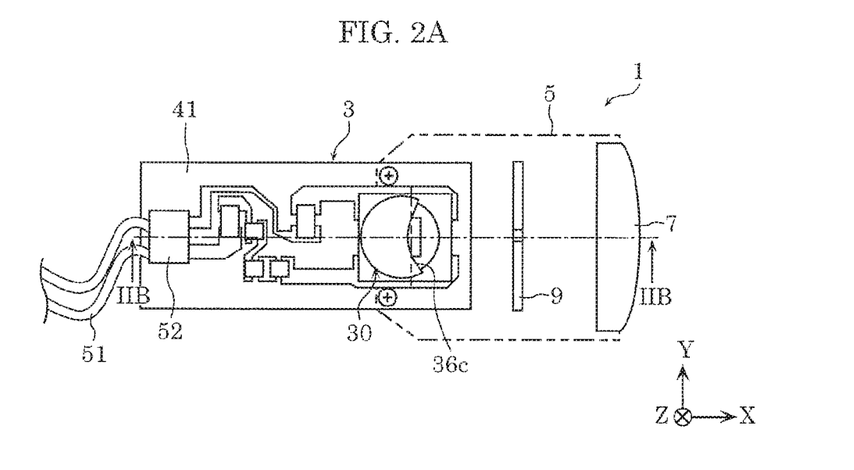
FIG. 2A is a plan view illustrating a moving-body illumination apparatus according to Embodiment 1.

FIG. 2A is a plan view illustrating moving-body illumination apparatus 1 according to Embodiment 1, in FIG. 2A, holding member 5 is drawn with an imaginary line.

X, Y, and Z directions are shown in FIG. 2A. The light emission direction in which moving-body illumination apparatus 1 emits light corresponds to the X axis positive direction, the direction toward the upper side of the drawing with respect to the light emission direction corresponds to the Y axis positive direction, and the direction toward pedestal 42 with respect to light-emitting element 32 corresponds to the Z axis positive direction. The directions shown in FIG. 2A correspond to the directions illustrated in FIG. 2B. This also applies to the drawings subsequent to FIG. 2B, except the drawings in which X, Y, and Z directions are not indicated.

Figure 2B:
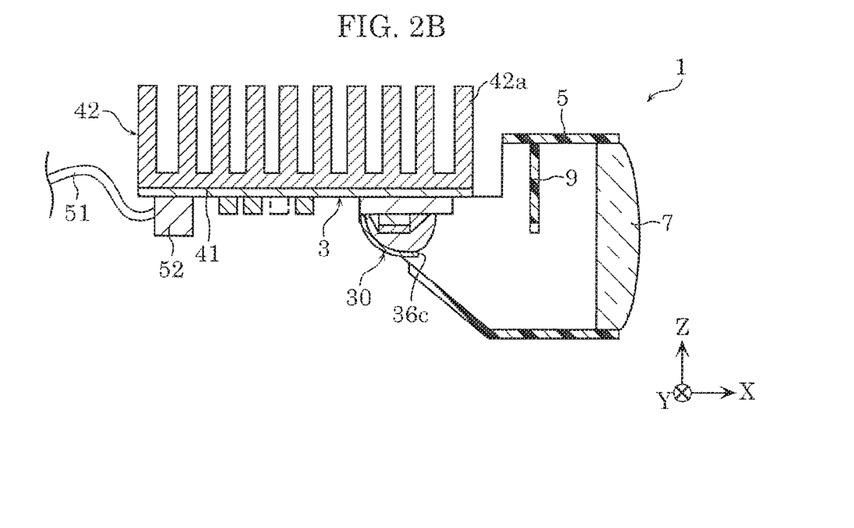
FIG. 2B is a cross-sectional view illustrating the moving-body illumination apparatus according to Embodiment 1, taken along line IIB-IIB in FIG. 2A.

FIG. 2B is a cross-sectional view illustrating moving-body illumination apparatus 1 according to Embodiment 1, taken along line IIB-IIB in FIG. 2A.

As illustrated in FIG. 2A and FIG. 2B, moving-body illumination apparatus 1 is a module used in vehicle 100. Moving-body illumination apparatus 1 includes moving-body light-emitting device 3, holding member 5, second lens 7, and shade 9.

Moving-body light-emitting device 3 includes light-emitting unit 30, substrate 41, and pedestal 42. Moving-body light-emitting device 3 is an example of the light-emitting device.

Figure 3:
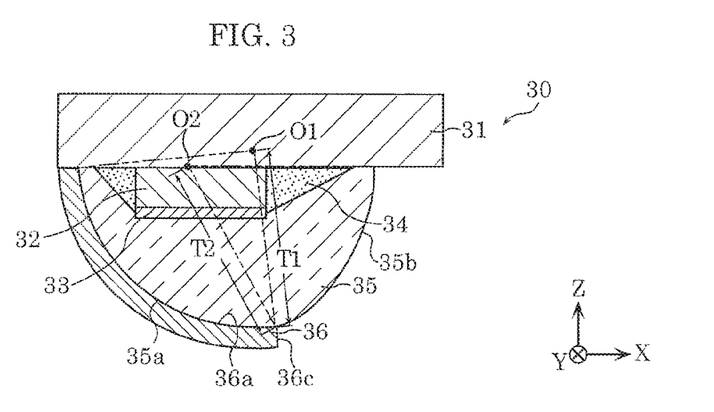
FIG. 3 is an enlarged cross-sectional view illustrating a light-emitting unit of the vehicle according to Embodiment 1.

FIG. 3 is an enlarged cross-sectional view illustrating light-emitting unit 30 of vehicle 100 according to Embodiment 1. As illustrated in FIG. 3, light-emitting unit 30 is capable of emitting light in a predetermined direction. In the present embodiment, light-emitting unit 30 emits light in the direction of travel of vehicle 100 when moving-body light-emitting device 3 is installed in vehicle 100. Light-emitting unit 30 includes a light source, white resin 34, first lens 35, reflector 36, and opening portion 36c. The light source includes at least light-emitting element 32 and phosphor 33, and may further include holding substrate 31.

Holding substrate 31 is a mounting substrate for mounting light-emitting element 32, and is, for example, a ceramic substrate, a resin substrate, or an insulation-coated metal based substrate. In the present embodiment, holding substrate 31 is a low temperature co-fired ceramics (LTCC) package substrate. Further, holding substrate 31 is, for example, rectangular in a plan view and has a plate shape having a plane. Light-emitting element 32, first lens 35, reflector 36, etc. are provided on a surface of holding substrate 31 on the Z axis negative direction side.

Light-emitting element 32 is mounted on the surface of holding substrate 31 on the Z axis negative direction side. The light emission direction in which light-emitting element 32 emits light is the Z axis negative direction. The Z axis negative direction is vertically downward.

Light-emitting element 32 emits light that is to be light emitted from moving-body illumination apparatus 1. In the present embodiment, light-emitting element 32 is a light-emitting module including a light emitting diode (LED), and is an LED light source that emits predetermined light radially. Light-emitting element 32 is configured to emit white light, for example. For example, light-emitting element 32 is a flip-chip LED and is an LED chip mounted on holding substrate 31. Further, a plurality of light-emitting elements 32 may be mounted on holding substrate 31.

Phosphor 33 is formed by applying phosphor particles or a phosphor-particle dispersed solution etc. to a surface of light-emitting element 32 on the Z axis negative direction side, that is, the upper surface of light-emitting element 32. Phosphor 33 is formed by, for example, dispersing yttrium aluminum garnet (YAG) in a binder made of a silicone resin or an epoxy resin at high concentration and applying the binder to only the upper surface of light emitting element 32. Phosphor 33 may include, for example, a phosphor ceramic plate obtained by sintering a phosphor material in a plate shape. Phosphor 33 converts the wavelength of light emitted from light-emitting element 32.

White resin 34 covers the outer side surfaces of light-emitting element 32 and phosphor 33. With this, even when light exits from the outer side surfaces of light-emitting element 32 and phosphor 33, white resin 34 reflects the light toward reflector 36.

First lens 35 is provided on the surface of holding substrate 31 on the Z axis negative direction side. First lens 35 covers light-emitting element 32 and has a curved surface that transmits light emitted from light-emitting element 32. First lens 35 seals light-emitting element 32, phosphor 33, and white resin 34. First lens 35 is an aspherical lens having an approximately semispherical shape, and is formed from a light-transmissive material such as transparent silicone, epoxy, glass, or acrylic. In the present embodiment, the curved surface is the front surface of first lens 35 and is an approximately semispherical surface. Further, in the present embodiment, a transparent silicone having a refractive index of approximately 1.4 is used as first lens 35. The refractive index of first lens 35 may be high so as to increase the light extraction ratio of light emitted from light-emitting element 32. Note that the shape of first lens 35 is not limited to an approximately semispherical shape, and may be an approximately semicircular arch shape.

The curved surface includes first curved surface 35a and second curved surface 35b. First curved surface 35a is covered with reflector 36. Second curved surface 35b is continuous with first curved surface 35a and is exposed from reflector 36. Curvature radius T1 of first curved surface 35a is the distance from center O1 to first curved surface 35a. Curvature radius T2 of second curved surface 35b is the distance from center O2 to second curved surface 35b. Curvature radius is different from curvature radius T2. In the present embodiment, curvature radius T1 is greater than curvature radius T2, but is not limited to this. Curvature radius T1 may be the same as or smaller than curvature radius T2. Although center O2 is located at a position different from center O1, center O2 may be located at the same position as center O1.

Reflector 36 is provided on a surface of holding substrate 31 and a surface of first lens 35 on the Z axis negative direction side. Reflector 36 is provided at a portion of the curved surface of first lens 35 and reflects light. Reflector 36 includes reflective surface 36a facing the curved surface of first lens 35. Reflector 36 is at least partially in contact with the curved surface of first lens 35. That is to say, reflector 36 covers a portion of the curved surface of first lens 35, and reflective surface 36a is at least partially in close contact with the curved surface of first lens 35. In the present embodiment, reflective surface 36a is entirely in close contact with first curved surface 35a of first lens 35.

Reflector 36 is, for example, a component containing a metal such as aluminum or a component containing a white resin material. Further, reflector 36 may be formed using a reflective material, such as: a mirror surface formed from a metal such as aluminum by vapor deposition, for example; coating with a highly reflective paint; or a reflective material such as a white plastic layer.

Reflective surface 36a is provided at a portion of the curved surface of first lens 35 and reflects the light transmitted through first lens 35. The light reflected by reflective surface 36a passes through opening portion 36c. That is to say, reflector 36 does not entirely cover the curved surface of first lens 35.

Second curved surface 35b exposed from opening portion 36c is a portion of the curved surface of first lens 35 not covered with reflective surface 36a, and transmits the light reflected by reflective surface 36a. Opening portion 36c faces the direction of travel of vehicle 100. That is to say, second curved surface 35b of first lens 35 exposed from opening portion 36c intersects the direction of travel of vehicle 100. Although opening portion 36c has an approximately elliptical shape when light-emitting unit 30 is viewed from the Z axis negative direction, it may have a semilunar shape or may have a fan shape.

Reflector 36 may be manufactured by forming, in advance, reflector 36 that serves as a cover body corresponding to the shape of first lens 35 and then fitting reflector 36 after generating first lens 35, so that reflective surface 36a is formed at first curved surface 35a of first lens 35. Alternatively, reflective surface 36a may be formed at first curved surface 35a by evaporating the base material of reflector 36 after forming first lens 35. Furthermore, first lens 35 may be formed by providing reflector 36 that serves as a mold for first lens 35 on holding substrate 31 in advance and injecting the base material of first lens 35 into reflector 36.

Holding substrate 31 on which light-emitting element 32 is mounted is mounted on substrate 41. Substrate 41 is, for example, a ceramic substrate, a resin substrate, or an insulation-coated metal based substrate. Further, substrate 41 has, for example, a plate shape having a rectangular plane in a plan view. Holding substrate 31 on which light-emitting element 32 is mounted is provided on a surface of substrate 41 on the Z axis negative direction side. A power feeder wire and a circuit board that are formed from metal plating etc. are formed on the surface of substrate 41 on the Z axis negative direction side. Substrate 41 is electrically connected with holding substrate 31 and light-emitting element 32 mounted on holding substrate 31.

Substrate 41 is provided with lead wire 51 that supplies power from a vehicle power source and connection terminal 52 that supplies substrate 41 with the power supplied from lead wire 51.

Pedestal 42 holds substrate 41. Pedestal 42 includes heat sink 42a formed on a side of pedestal 42 opposite a side thereof where substrate 41 is provided. Heat sink 42a dissipates heat of light-emitting element 32. Heat sink 42a is formed on the Z axis positive direction side of pedestal 42 opposite the side thereof facing the light emission direction, dissipates the heat generated in light-emitting element 32, and includes a plurality of fins.

As illustrated in FIG. 2A and FIG. 2B, holding member 5 is, for example, a black tubular housing, is formed across opening portion 36c, which transmits light from light-emitting element 32, from connection terminal 52, and transmits light. Holding member 5 is fixed to pedestal 42 by a fixing member such as a bolt inserted into a screw hole.

Second lens 7 is provided in front of moving-body light-emitting device 3 (the X axis positive direction) in the direction of travel of vehicle 100, and receives light emitted from moving-body light-emitting device 3. Second lens 7 is, for example, a light-transmissive one-side convex lens. A surface of second lens 7 on the X axis positive direction side bows outward. The outwardly bowed surface of second lens 7 is rounded, whereas the surface of second lens 7 on the X axis negative direction side is flat. Second lens 7 may be a double-side convex lens in which the surface on the X axis negative direction side bows outward as well. Second lens 7 is provided on the X axis positive direction side of holding member 5, covering the front opening of holding member 5. In addition, second lens 7 covers opening portion 36c when viewed from the X axis positive direction. Light emitted from light-emitting element 32 passes through the inside of holding member 5 and enters second lens 7.

Shade 9 is provided between moving-body light-emitting device 3 and second lens 7 and shields a portion of light emitted from moving-body light emitting device 3. Shade 9 is black and plate-shaped, and includes a resin material, a metal material, etc. Shade 9 shields a portion of the light so that the light has a light distribution pattern of headlight 10 specified by the laws and regulations. Shade 9 is provided in holding member 5 on the Z axis positive direction side and is provided approximately parallel to a plane defined by the Y axis direction and the Z axis direction. The shape of shade 9 is appropriately adjusted to form a portion of the light distribution pattern. Note that shade 9 may be provided in the vicinity of the focal point of first lens 35. Shade 9 is an example of the shield.

In such moving-body illumination apparatus 1, phosphor 33 converts the wavelength of light emitted from light-emitting element 32. The light whose wavelength has been converted by phosphor 33 passes through first lens 35 to be incident on reflective surface 36a of reflector 36. The light incident on reflective surface 36a is reflected by reflective surface 36a and exits through second curved surface 35b of first lens 35. A portion of the light exiting through second curved surface 35b is shielded by shade 9, and the remaining light passes through holding member 5 and enters second lens 7. The light entering second lens 7 passes through the inside thereof and exits through second lens 7. Light is emitted from headlight 10 in this manner.

Advantageous Effects

Next, advantageous effects of moving-body light-emitting device 3, moving-body illumination apparatus 1, and vehicle 100 according to the present embodiment are described.

As described above, moving-body light-emitting device 3 according to the present embodiment is moving-body light-emitting device 3 for use in vehicle 100. Moving-body light-emitting device 3 includes: a light source including light-emitting element 32; substrate 41 on which the light source is provided; first lens 35 that covers light-emitting element 32 and includes a curved surface that transmits light emitted from light-emitting element 32, the curved surface including a first portion (first curved surface 35a) and a second portion (second curved surface 35b); and reflective surface 36a that covers the first portion of the curved surface of first lens 35 and reflects the light transmitted through first lens 35. Second curved surface 35b of first lens 35 is not covered with reflective surface 36a, and transmits the light reflected by reflective surface 36a.

As described above, second curved surface 35b is the second portion of the curved surface of first lens 35 not covered with reflective surface 36a, and transmits the light reflected by reflective surface 36a. Second curved surface 35b faces the direction of travel of vehicle 100. Therefore, the light emitted from light-emitting element 32 is reflected by reflective surface 36a provided at a portion of the curved surface of first lens 35, and exits through second curved surface 35b from which first lens 35 is exposed. Further, since second curved surface 35b faces the direction of travel of vehicle 100, the light exiting through second curved surface 35b travels in the direction of travel of vehicle 100. In such a manner as described, reflective surface 36a plays a role equivalent to a conventional, large bowl-shaped reflector provided surrounding a surrounding region of the first lens in a state of being separated from the first lens. Accordingly, there is no need to provide the conventional reflector, thereby allowing moving-body light-emitting device 3 to be smaller than the conventional device.

As such, moving-body light-emitting device 3 can be downsized. In addition, since no reflector is used, it is possible to reduce the manufacturing cost. Even when reflector 36 of the present disclosure is employed in moving-body light-emitting device 3 in place of the conventional reflector, it is possible to maintain the amount of light emitted from moving-body light-emitting device 3 attached to vehicle 100.

Further, moving-body illumination apparatus 1 according to the present embodiment includes moving-body light-emitting device 3; second lens 7 that is provided in front of moving-body light-emitting device 3 in the direction of travel of vehicle 100, and receives light emitted from moving-body light-emitting device 3; and shade 9 that is provided between moving-body light-emitting device 3 and second lens 7 and shields a portion of the light emitted from moving-body light-emitting device 3.

Furthermore, vehicle 100 according to the present embodiment includes headlight 10 including moving-body light-emitting device 3 or moving-body illumination apparatus 1.

Moving-body illumination apparatus 1 and vehicle 100 also yield the same advantageous effects as those described above.

Furthermore, moving-body light-emitting device 3 according to the present embodiment further includes reflector 36 including reflective surface 36a that faces the first portion of the curved surface of first lens 35. Reflector 36 is at least partially in contact with the first portion of the curved surface of first lens 35.

As described above, reflector 36 is at least partially in contact with the curved surface of first lens 35. Therefore, reflector 36 is not likely to become large. As a result, it is possible to more reliably downsize moving-body light-emitting device 3.

Moreover, moving-body illumination apparatus 1 according to the present embodiment further includes pedestal 42 that holds substrate 41. Pedestal 42 includes heat sink 42a provided on a side of pedestal 42 opposite a side of pedestal 42 where substrate 41 is provided. Heat sink 42a dissipates heat of light-emitting element 32.

As stated above, pedestal 42 includes heat sink 42a provided on a side of pedestal 42 opposite a side of pedestal 42 where substrate 41 is provided. Heat sink 42a dissipates heat of light-emitting element 32. Therefore, the heat generated in light-emitting element 32 can be dissipated, thereby increasing the lifespan of light-emitting element 32.

Further, in a state in which moving-body illumination apparatus 1 according to the present embodiment is attached to vehicle 100, a light emission direction in which light-emitting element 32 emits light is downward. Heat sink 42a is provided on a side of pedestal 42 opposite a side of pedestal 42 facing the light emission direction.

In moving-body illumination apparatus 1 according to the present embodiment, the light emission direction is vertically downward.

As stated above, the light emission direction in which light-emitting element 32 emits light is vertically downward. Heat sink 42a is provided on a side of pedestal 42 opposite a side of pedestal 42 facing the light emission direction. Accordingly, since light-emitting element 32 emits light vertically downward, heat sink 42a can be provided above light-emitting element 32. In this case, the heat generated in light-emitting element 32 is conducted to heat sink 42a, which is thereby heated. A fluid around heat sink 42a takes heat away from heated heat sink 42a, and the fluid therefore rises. As a result, an airflow is generated around heat sink 42a, allowing heat sink 42a to dissipate heat easily.

In moving-body light-emitting device 3 according to the present embodiment, curvature radius T1 of the first portion of the curved surface of first lens 35 is different from curvature radius T2 of the second portion of the curved surface of first lens 35.

Further, in moving-body light-emitting device 3 according to the present embodiment, the second portion faces the direction of travel of vehicle 100.

Variation 1 of Embodiment 1

Figure 4:
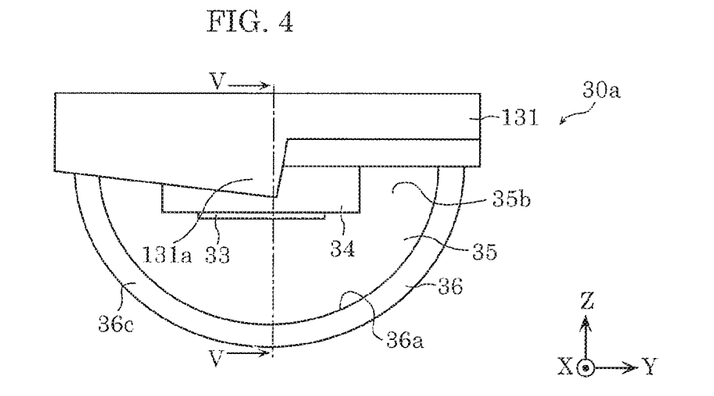
FIG. 4 is an enlarged front view illustrating a light-emitting unit of a vehicle according to Variation 1 of Embodiment 1.
Figure 5:
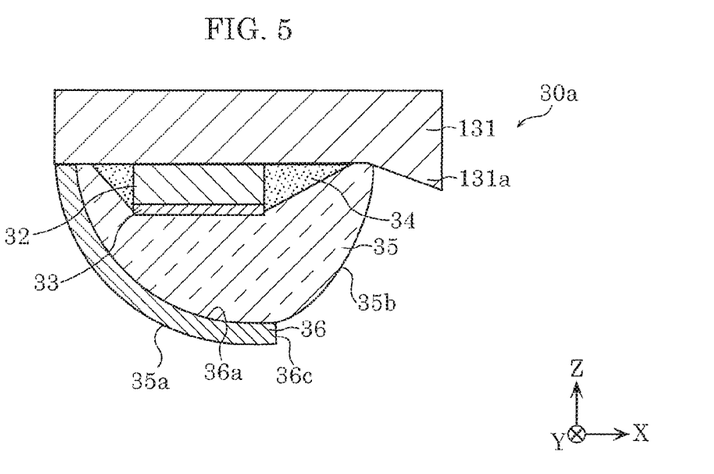
FIG. 5 is an enlarged cross-sectional view illustrating the light-emitting unit of the vehicle according to Variation 1 of Embodiment 1, taken along line V-V in FIG. 4.

FIG. 4 is an enlarged front view illustrating light-emitting unit 30a of vehicle 100 according to Variation 1 of Embodiment 1. FIG. 5 is an enlarged cross-sectional view illustrating light-emitting unit 30a of vehicle 100 according to Variation 1 of Embodiment 1, taken along line V-V in FIG. 4.

The present variation is different from Embodiment 1 in that second substrate 131 has protrusion 131a. Moving-body light-emitting device 3 according to the present variation is the same as that in Embodiment 1 etc. unless specified otherwise. The same reference signs are given to the same structural elements, and the detailed description of the same structural elements is omitted.

As illustrated in FIG. 4 and FIG. 5, light-emitting unit 30a according to the present variation has, at an edge of second substrate 131 on the X axis positive direction side, protrusion 131a which shields a portion of light exiting through first lens 35. Protrusion 131a is provided ahead of first lens 35 (the X axis positive direction) in the direction of travel of vehicle 100. Protrusion 131a is formed in second substrate 131 and protrudes in the Z axis negative direction. Protrusion 131a shields a portion of light so that the light has a light distribution pattern of headlight 10 specified by the laws and regulations. In other words, protrusion 131a plays the role of shade 9.

Since moving-body light-emitting device 3, moving-body illumination apparatus 1, and vehicle 100 that include such light-emitting unit 30a need not use shade 9, the number of components can be reduced, thereby enabling reduction in the manufacturing cost.

Variation 2 of Embodiment 1

Figure 6:
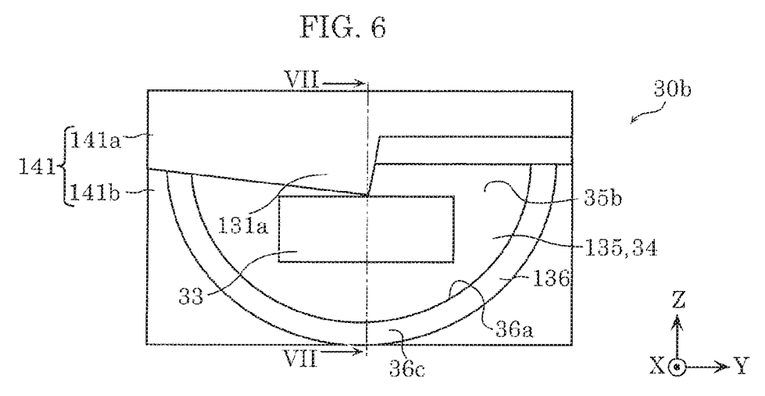
FIG. 6 is an enlarged front view illustrating a light-emitting unit of a vehicle according to Variation 2 of Embodiment 1.
Figure 7:
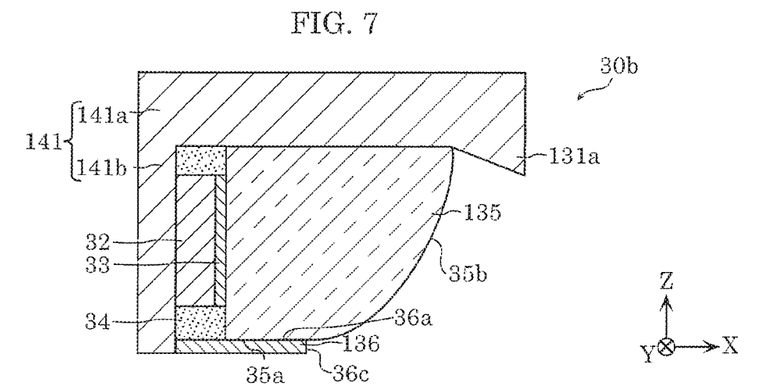
FIG. 7 is an enlarged cross-sectional view illustrating the light-emitting unit of the vehicle according to Variation 2 of Embodiment 1, taken along line VII-VII in FIG. 6.

FIG. 6 is an enlarged front view illustrating light-emitting unit 301) of vehicle 100 according to Variation 2 of Embodiment 1. FIG. 7 is an enlarged cross-sectional view illustrating light-emitting unit 30b of vehicle 100 according to Variation 2 of Embodiment 1, taken along line VII-VII in FIG. 6.

The present variation is different from Embodiment 1 in that light-emitting element 32 is oriented on second substrate 141 to emit light in the direction of travel of vehicle 100. Moving-body light-emitting device 3 according to the present variation is the same as that in Embodiment 1 etc. unless specified otherwise. The same reference signs are given to the same structural elements, and the detailed description of the same structural elements is omitted.

As illustrated in FIG. 6 and FIG. 7, in the present variation, second substrate 141 is bent in an L shape in a cross-sectional view. Second substrate 141 includes horizontal portion 141a and vertical portion 141b. Horizontal portion 141a is approximately parallel to a plane defined by the X axis direction and the Y axis direction. Vertical portion 141b extends in the Z axis negative direction with respect to horizontal portion 141a from an edge of horizontal portion 141a on the X axis negative direction side. Vertical portion 141b is approximately parallel to a plane defined by the Z axis direction and the Y axis direction. Light-emitting element 32 is mounted on a surface of vertical portion 141b on the X axis positive direction side. Specifically, light-emitting element 32 is oriented on vertical portion 141b to emit light in the X axis positive direction.

Phosphor 33 is formed by being applied to a surface of light-emitting element 32 on the X axis positive direction side. The outer side surfaces of light-emitting element 32 and phosphor 33 are covered with white resin 34.

First lens 135 covers light-emitting element 32 and phosphor 33 when light-emitting unit 30b is viewed from the X axis negative direction. First lens 135 has an approximately semicircular arch shape.

Reflector 136 is provided on a curved surface which is the outer side surface of first lens 135. Reflector 136 has an approximately semicircular arch shape as well.

Variation 3 of Embodiment 1

Figure 8:
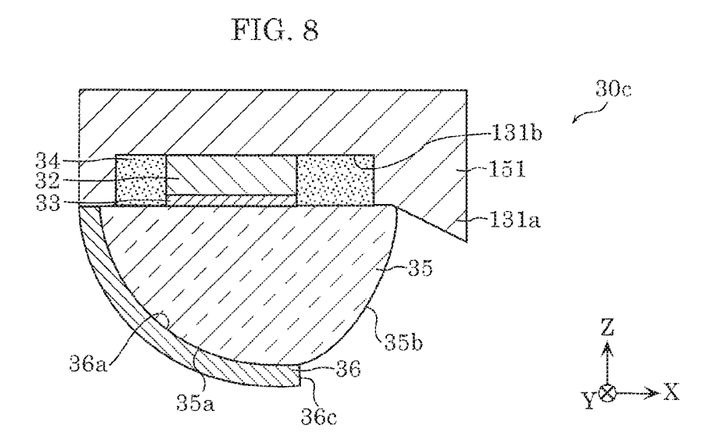
FIG. 8 is an enlarged cross-sectional view illustrating a light-emitting unit of a vehicle according to Variation 3 of Embodiment 1.

FIG. 8 is an enlarged cross-sectional view illustrating light-emitting unit 30c of vehicle 100 according to Variation 3 of Embodiment 1.

The present variation is different from Embodiment 1 etc. in that light-emitting element 32 is provided to be housed in second substrate 151. Moving-body light-emitting device 3 according to the present variation is the same as that in Embodiment 1 etc. unless specified otherwise. The same reference signs are given to the same structural elements, and the detailed description of the same structural elements is omitted.

As illustrated in 8, second substrate 151 has recessed portion 131b in which light-emitting element 32 and phosphor 33 are housed. In a state of housing light-emitting element 32 and phosphor 33, recessed portion 131b is filled with white resin 34 on the outer side surfaces of light-emitting element 32 and phosphor 33. A surface of phosphor 33 on the Z axis negative direction side is exposed from white resin 34.

First lens 35 seals light-emitting element 32, phosphor 33, and white resin 34 housed in recessed portion 131b.

Embodiment 2

Figure 9:
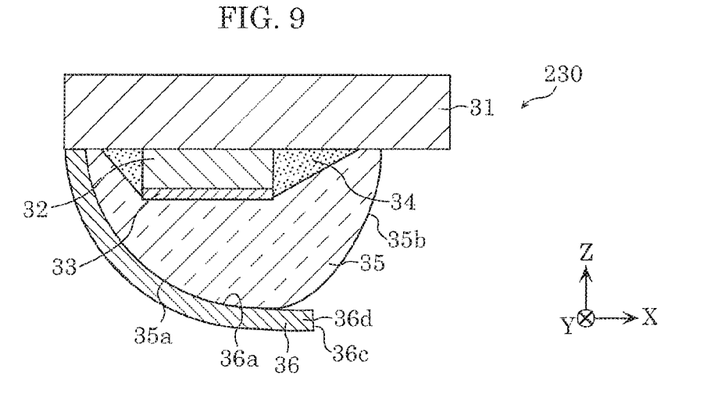
FIG. 9 is an enlarged cross-sectional view illustrating a light-emitting unit of a vehicle according to Embodiment 2.

FIG. 9 is an enlarged cross-sectional view illustrating light-emitting unit 230 of vehicle 100 according to Embodiment 2.

The present embodiment is different from Embodiment 1 etc. in that reflector 36 of moving-body illumination apparatus 1 includes separated portion 36d. Moving-body illumination apparatus 1 according to the present embodiment is the same as that in Embodiment 1 etc. unless specified otherwise. The same reference signs are given to the same structutral elements, and the detailed description of the same structural elements is omitted.

Reflector 36 includes separated portion 36d that is separated from first lens 35 in the light emission direction in the vicinity of second curved surface 35b. Separated portion 36d extends in a flange shape from the tip end of reflector 36, that is, from an edge of reflector 36 on the X axis positive direction side, and is separated from second curved surface 35b toward the outside of first lens 35. The inner surface of separated portion 36d facing the curved surface of first lens 35 is reflective surface 36a that reflects light. Reflective surface 36a of separated portion 36d is included in reflective surface 36a that is the inner surface of reflector 36.

Advantageous Effects

Next, advantageous effects of moving-body light-emitting device 3 according to the present embodiment are described.

As described above, in moving-body light-emitting device 3 according to the present embodiment, reflector 36 includes separated portion 36d that is separated from first lens 35 in the vicinity of second curved surface 35d (the second portion). The inner surface of separated portion 36d facing the curved surface of first lens 35 is reflective surface 36a that reflects light.

As stated above, reflector 36 includes separated portion 36d that is separated from first lens 35 in the vicinity of second curved surface 35d. Thus, the light exiting through second curved surface 35b is led by reflective surface 36a of separated portion 36d, thereby being easily guided in the direction of travel of vehicle 100. As a result, the amount of light emitted from moving-body light-emitting device 3 can be easily secured.

The other advantageous effects yielded by the present embodiment are the same as those in Embodiment 1 etc.

Embodiment 3

Figure 10:
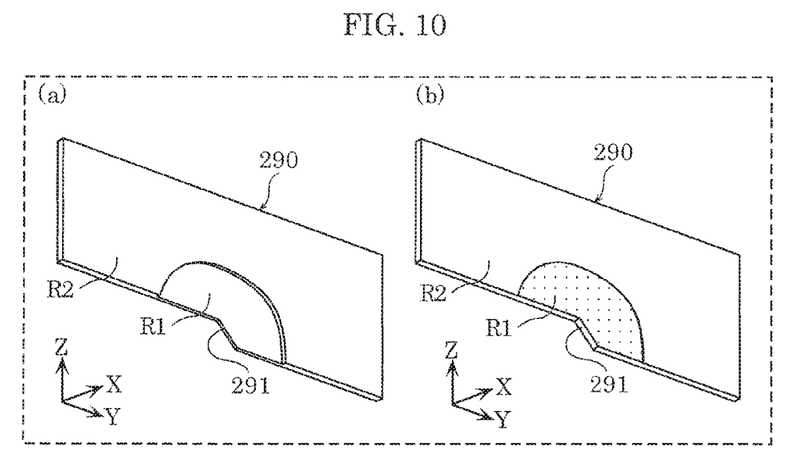
FIG. 10 is a schematic view illustrating a shade of a moving-body illumination apparatus according to Embodiment 3.

FIG. 10 is a schematic view illustrating shade 290 of moving-body illumination apparatus 1 according to Embodiment 3.

The present embodiment is different from Embodiment 1 etc. in that shade 290 of moving-body illumination apparatus 1 has semi-transmissive region R1 capable of transmitting a portion of incident light. Moving-body illumination apparatus 1 according to the present embodiment is the same as that in Embodiment 1 etc. unless specified otherwise. The same reference signs are given to the same structural elements, and the detailed description of the same structural elements is omitted.

As illustrated in FIG. 10, shade 290 has semi-transmissive region R1 capable of transmitting a portion of incident light and non-transmissive region R2 that shields light. Semi-transmissive region R1 is provided in the vicinity of edge 291 of shade 290. In shade 290, semi-transmissive region R1 is recessed toward light-emitting unit 30 with respect to non-transmissive region R2. Edge 291 of shade 290 constitutes a cutoff line that cuts off a portion of light reflected by reflective surface 36a and allows the remaining light to enter second lens 7.

As illustrated in FIG. 2B and FIG. 10, in the present embodiment, semi-transmissive region R1 intersects with the optical axis of light-emitting unit 30 and is formed at the central portion of edge 291 of shade 290.

As illustrated in (a) in FIG. 10, semi-transmissive region R1 may be thinner than non-transmissive region R2. With shade 290, the thickness of semi-transmissive region R1 is smaller than the thickness of non-transmissive region R2, so that light easily passes through semi-transmissive region R1. In addition, as illustrated in (b) in FIG. 10, semi-transmissive region R1 may include a plurality of fine holes passing through shade 290. With shade 290, semi-transmissive region R1 includes a plurality of fine holes, so that light easily passes through semi-transmissive region R1. The fine holes are formed by punching, for example.

Figure 11:
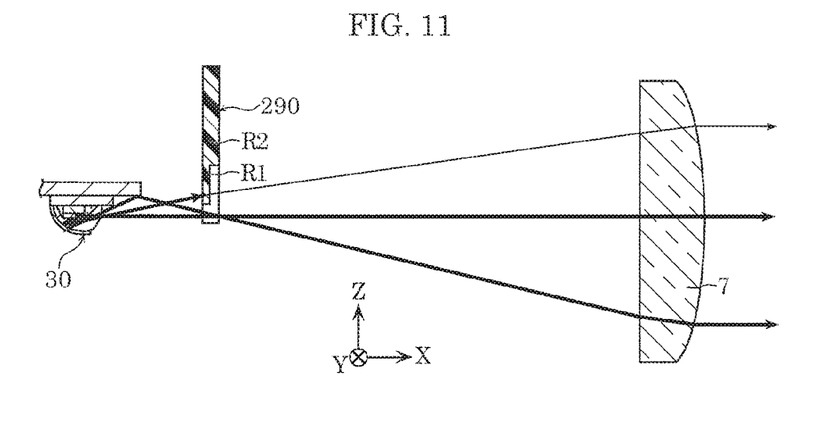
FIG. 11 is a diagram for describing light that passes through the moving-body illumination apparatus according to Embodiment 3.

FIG. 11 is a diagram for describing tight that passes through moving-body illumination apparatus 1 according to Embodiment 3. The bold solid lines illustrated in FIG. 11 indicate light not shielded by shade 290. The thin solid line illustrated in FIG. 11 indicates light passing through semi-transmissive region R1.

As illustrated in FIG. 11, by providing semi-transmissive region R1 in shade 290 as in (a) and (b) in FIG. 10, light from moving-body illumination apparatus 1 not shielded by shade 290 travels toward second lens 7, and light from moving-body illumination apparatus 1 weakened by semi-transmissive region R1 also travels toward second lens 7. Of the light weakened by semi-transmissive region R1, light traveling vertically upward with respect to the direction of travel of vehicle 100 is also referred to as overhead distributed light.

Advantageous Effects

Next, advantageous effects of moving-body illumination apparatus 1 according to the present embodiment are described.

As described above, in moving-body illumination apparatus 1 according to the present embodiment, shade 290 includes semi-transmissive region R1 capable of transmitting a portion of incident light and non-transmissive region R2 that shields light. Semi-transmissive region R1 is provided in the vicinity of edge 291 of shade 290.

By providing semi-transmissive region R1 in the vicinity of edge 291 of shade 290 as described above, incident light in the vicinity of edge 291 is weakened by semi-transmissive region R1. With this, overhead light distribution can be realized.

In addition, in moving-body illumination apparatus 1 according to the present embodiment, shade 290 has a plate shape. Semi-transmissive region R1 is thinner than non-transmissive region R2.

As described above, it is possible to easily realize overhead light distribution by making semi-transmissive region R1 thinner than non-transmissive region R2.

Further, in moving-body illumination apparatus 1 according to the present embodiment, semi-transmissive region R1 may include a plurality of fine holes.

It is possible to realize overhead light distribution by forming a plurality of fine holes in semi-transmissive region R1 as described above.

The other advantageous effects yielded by the present embodiment are the same as those in Embodiment 1.

Other Variations etc.

Although the present disclosure has been described based on Embodiments 1 to 3 and Variations 1 to 3 of Embodiment 1, the present disclosure is not limited to Embodiments 1 to 3 and Variations 1 to 3 of Embodiment 1.

For example, in Embodiments 1 to 3 and Variations 1 to 3 of Embodiment 1 described above, the reflective surface may be formed by changing the shape of the first curved surface of the first lens so as to totally reflect light emitted from the light-emitting element. Light passing through the first lens is reflected by the reflective surface that is the first curved surface. In this case, the reflective surface is formed in the first lens. Accordingly, light can be reflected by the reflecting surface without use of a reflector, thereby enabling reduction of the manufacturing cost of the moving-body light-emitting device and the moving-body illumination apparatus.

Apart from the above, the present disclosure also encompasses embodiments obtained by making various modifications to Embodiments 1 to 3 and Variations 1 to 3 of Embodiment 1 that can be conceived by a person skilled in the art, as well as embodiments implemented by arbitrarily combining structural elements and functions in Embodiments 1 to 3 and Variations 1 to 3 of Embodiment 1 within the scope of the essence of the present disclosure.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. An illumination apparatus comprising:
   a light emitting device for a moving body, the light emitting device including:
   a light source including a light-emitting element;
   a substrate on which the light source is provided;
   a first lens that covers and seals the light-emitting element on the substrate and includes a curved surface that transmits light emitted from the light-emitting element, the curved surface including a first portion and a second portion; and
   a reflective surface that covers the first portion of the curved surface of the first lens and reflects the light transmitted through the first lens,
   wherein the second portion of the curved surface of the first lens is not covered with the reflective surface, and transmits the light reflected by the reflective surface;
   a second lens that is provided in front of the light-emitting device in a direction of travel of the moving body, and receives light emitted from the light-emitting device;
   a shield that is provided between the light-emitting device and the second lens and shields a portion of the light emitted from the light-emitting device; and
   a pedestal that holds the substrate, wherein the pedestal includes a heat sink provided on a side of the pedestal opposite a side of the pedestal where the substrate is provided, the heat sink dissipating heat of the light-emitting element, in a state in which the light-emitting device is attached to the moving body, a light emission direction in which the light-emitting element emits light is downward, and the heat sink is provided on a side of the pedestal opposite a side of the pedestal facing the light emission direction.

2. The illumination apparatus according to claim 1, wherein the light-emitting device further comprises:

a reflector including the reflective surface that faces the first portion of the curved surface of the first lens, wherein the reflector is at least partially in contact with the first portion of the curved surface of the first lens.

3. The illumination apparatus according to claim 2, wherein the reflector includes a separated portion that is separated from the first lens in a vicinity of the second portion, and an inner surface of the separated portion facing the curved surface of the first lens is a reflective surface that reflects light.

4. The illumination apparatus according to claim 1, wherein a curvature radius of the first portion of the curved surface of the first lens is different from a curvature radius of the second portion of the curved surface of the first lens.

5. The illumination apparatus according to claim 1, wherein the shield includes a semi-transmissive region capable of transmitting a portion of incident light and a non-transmissive region that shields light, and the semi-transmissive region is provided in a vicinity of an edge of the shield.

6. The illumination apparatus according to claim 5, wherein the shield has a plate shape, and the semi-transmissive region is thinner than the non-transmissive region.

7. The illumination apparatus according to claim 5, wherein the semi-transmissive region includes a plurality of fine holes.

8. A moving body, comprising:

a headlight including the illumination apparatus according to claim 1.

9. The illumination apparatus according to claim 1, wherein the second portion faces a direction of travel of the moving body.

10. The illumination apparatus according to claim 1, wherein the light emission direction is vertically downward.

11. The illumination apparatus according to claim 1, wherein the reflective surface is provided on a portion of the first lens opposed to a portion of the first lens closer to the second lens, and the second portion of the curved surface faces the second lens.

* * * * *